(12) United States Patent
Weintraub

(10) Patent No.: US 8,769,357 B1
(45) Date of Patent: Jul. 1, 2014

(54) SYSTEM AND METHOD FOR EVALUATION OF A FIELD PROGRAMMABLE GATE ARRAY (FPGA)

(75) Inventor: Reuven Weintraub, Ein Ayala (IL)

(73) Assignee: GiDEL Ltd., Or-Akiva (IL)

( * ) Notice: Subject to any disclaimer, the term of this patent is extended or adjusted under 35 U.S.C. 154(b) by 550 days.

(21) Appl. No.: 12/841,193

(22) Filed: Jul. 22, 2010

Related U.S. Application Data

(60) Provisional application No. 61/227,970, filed on Jul. 23, 2009.

(51) Int. Cl.
*H03M 13/00* (2006.01)
(52) U.S. Cl.
USPC .................................................. 714/725
(58) Field of Classification Search
USPC ........... 714/30–33, 37, 38.1, 39–41, 45, 47.1, 714/715, 720, 724, 725, 742, 745
See application file for complete search history.

(56) References Cited

U.S. PATENT DOCUMENTS

| | | | | |
|---|---|---|---|---|
| 5,425,036 A | * | 6/1995 | Liu et al. | 714/735 |
| 5,844,422 A | * | 12/1998 | Trimberger et al. | 326/38 |
| 5,867,507 A | * | 2/1999 | Beebe et al. | 714/726 |
| 6,191,683 B1 | * | 2/2001 | Nygaard, Jr. | 340/146.2 |
| 6,681,353 B1 | * | 1/2004 | Barrow | 714/725 |
| 6,760,898 B1 | * | 7/2004 | Sanchez et al. | 716/111 |
| 7,865,790 B1 | * | 1/2011 | Jairam et al. | 714/726 |
| 2006/0005173 A1 | * | 1/2006 | Eng | 717/140 |

* cited by examiner

*Primary Examiner* — Nadeem Iqbal
(74) *Attorney, Agent, or Firm* — Oren Reches

(57) ABSTRACT

A method for evaluation of a field programmable gate array (FPGA), the method includes: configuring the FPGA to execute, in parallel, an evaluation program and an additional program; wherein an execution of the additional program is being evaluated by the evaluation program; and executing, by the FPGA the evaluation program and the additional program; wherein the executing includes receiving, by a memory controller of the FPGA, captured signals from multiple points of interest of the FPGA; and transferring, by the memory controller of the FPGA, at least a portion of the captured signals to at least one memory space of a memory block via memory channels of the FPGA.

40 Claims, 10 Drawing Sheets

```
┌─────────────────────────────────────────────────────────────────────────┐
│ Configuring the FPGA to execute, in parallel, an evaluation program and │
│ an additional program; wherein an execution of the additional program   │
│ is being evaluated by the evaluation program.                           │
│                                  610                                    │
└─────────────────────────────────────────────────────────────────────────┘
   ┌──────────────────────────────────────────────────────────────────┐
   │ Sending to the memory controller of the FPGA predefined responses│
   │ to triggers received by the memory controller of the FPGA. 620   │
   └──────────────────────────────────────────────────────────────────┘
   ┌──────────────────────────────────────────────────────────────────┐
   │ Selecting captured signals to be stored in the memory block and  │
   │ selecting captured signals to be ignored of; wherein the         │
   │ selecting is responsive to a stage of a evaluation process. 630  │
   └──────────────────────────────────────────────────────────────────┘
   ┌──────────────────────────────────────────────────────────────────┐
   │ Selecting captured signals to be stored in the memory block and  │
   │ selecting captured signals to be ignored of; wherein the         │
   │ selecting is responsive previously detected errors in an         │
   │ execution of the additional program by the FPGA. 640             │
   └──────────────────────────────────────────────────────────────────┘
                                     │
                                     ▼
┌─────────────────────────────────────────────────────────────────────────┐
│ Receiving, by a memory controller of the FPGA, captured signals from    │
│ multiple points of interest of the FPGA. The captured signals can be    │
│ received at a high rate from many points of interest. 660               │
└─────────────────────────────────────────────────────────────────────────┘
          ┌───────────────────────────────────────────────────┐
          │        Processing the captured signals. 665       │
          └───────────────────────────────────────────────────┘
┌─────────────────────────────────────────────────────────────────────────┐
│ Transferring, by the memory controller of the FPGA, at least a portion  │
│ of the captured signals to at least one memory space of a memory block, │
│ block via memory channels of the FPGA. 670                              │
└─────────────────────────────────────────────────────────────────────────┘
┌─────────────────────────────────────────────────────────────────────────┐
│ Outputting, by the memory controller of the FPGA, at least a portion of │
│ the captured signals from the FPGA via a communication element.         │
│                                  680                                    │
└─────────────────────────────────────────────────────────────────────────┘
┌─────────────────────────────────────────────────────────────────────────┐
│ Duplicating, by the memory controller of the FPGA, a captured signal to │
│ provide two duplicates of the captured signals. 690                     │
└─────────────────────────────────────────────────────────────────────────┘
┌─────────────────────────────────────────────────────────────────────────┐
│ Receiving, by the memory controller of the FPGA, at least one video     │
│ related control signal selected from a frame indication and a valid     │
│ indication and storing video related captured signals from at least one │
│ point of interest to the memory block. 685                              │
└─────────────────────────────────────────────────────────────────────────┘
                      600              FIG. 6
```

FIG. 8

| Record | | | |
|---|---|---|---|
| Name | From Bit | To Bit | |
| Field_Frame1 | 0 | 25 | |
| Field_DSP | 26 | 89 | |
| Field_Image_Di... | 90 | 90 | |
| Field_Image_Er... | 91 | 127 | |

Port Width: 128

Add
Remove
Properties
Ok

SYSTEM AND METHOD FOR EVALUATION OF A FIELD PROGRAMMABLE GATE ARRAY (FPGA)

RELATED APPLICATIONS

This application claims the priority of U.S. provisional patent Ser. No. 61/227,970, filing date Jul. 23, 2009 which is incorporated herein by reference.

BACKGROUND OF THE INVENTION

Reconfigurable FPGA designs enable extremely flexible and powerful parallel processing architecture, yet have been somewhat impeded by a lack of evaluation tools. The complexity of today's design makes it almost impossible to debug a design using traditional logic analysis methods. Evaluation often captures over 50% of the development time. Thus, an efficient flexible evaluation tool that is founded on accurate signal capture and abundant visibility depth is essential to accelerating/optimizing the developmental cycle. Another approach for evaluation is Emulation, but it is much slower and much more expensive.

SUMMARY OF THE INVENTION

A method may be provided. The method may include, according to an embodiment of the invention: configuring the FPGA to execute, in parallel, an evaluation program and an additional program; wherein the execution of the additional program is being evaluated by the evaluation program; and executing, by the FPGA the evaluation program and the additional program; wherein the executing includes: receiving, by a memory controller of the FPGA, captured signals from multiple points of interest of the FPGA; transferring, by the memory controller of the FPGA, at least a portion of the captured signals to at least one memory space of a memory, block via memory channels of the FPGA; and optionally outputting, by the memory controller of the FPGA, at least a portion of the captured signals from the FPGA via a communication element, for example, to a Host computer.

The multiple points of interest may include at least forty points of interest.

The method may include receiving captured signals from at least forty eight points of interest and at a rate of at least sixteen bytes per cycle.

The width of a single point of interest can range between a single bit and multiple bits. For example, a width of a single point of interest can even exceed 400.

Different points of interest may be sampled at the same rate but may also differ from each other by their sampling rates.

The sampling rate of the points of interest can be low, high and even very high. For example, the sampling rate can range between 10 Hz to more than 900 MHz.

The aggregate size of the at least one memory space may exceed one gigabyte.

The configuring may include sending to the memory controller of the FPGA predefined responses to triggers received by the memory controller of the FPGA.

A predefined response may include at least one of the following: (i) storing an outcome of an execution of a predefined response to a trigger at the memory block and outputting the outcome; (ii) storing captured signals of a certain type while ignoring captured signals of another type; (iii) stopping a capture of captured signals from a point of interest; and (iv) starting a capture of captured signals from the point of interest.

A predefined response may include stopping the sampling after a predefined period of time (or after a predefined number of samples or frames).

The configuring may include selecting captured signals to be stored in the memory block and selecting captured signals to be ignored of; wherein the selecting is responsive to a stage of an evaluation process.

The configuring may include selecting captured signals to be stored in the memory block and selecting captured signals to be ignored of; wherein the selecting is responsive to previously obtained data or previously detected errors in an execution of the additional program by the FPGA.

The method may include transferring, by the memory controller of the FPGA, at least a portion of the captured signals to at least one memory space of a memory block based on a mapping between memory channels of the memory controller and memory spaces of the memory block.

The method may include receiving, by the memory controller of the FPGA, at least one (possibly video related) control signal selected from a frame indication and a valid indication and storing (possibly video related) captured signals from at least one point of interest to the memory block The method may include duplicating, by the memory controller of the FPGA, a captured signal to provide two duplicates of the captured signals; transferring, by the memory controller of the FPGA, one duplicate of the captured signal to the memory block and outputting, by the memory controller of the FPGA, another duplicate of the captured signal from the FPGA via the communication element, for example, to a Host computer The method may include receiving a request from a user, for obtaining captured signals that have been captured at previous point in time that occurred at least one fraction of a second before the receiving of the request; and optionally sending to a host computer the captured signals. The user can receive signals that were captured few seconds, few minutes, few hours and even a longer period before the request to obtain captured signals.

The method may include receiving a request from a user, for stopping an execution of the additional program; and ignoring captured signals that have been stored before receiving the request by the memory controller of the FPGA but after the request has been issued by the user.

The method may include tagging captured signals and retrieving captured signals from the memory block based on values of tags associated with the captured signals.

A device for evaluation of a field programmable gate array (FPGA) may be provided. According to an embodiment of the invention the device may include: a memory block and an FPGA coupled to the memory block. The FPGA may include a logic module (such as a core); a memory controller; and multiple probes coupled between points of interest of the logic module and the memory controller; wherein the logic module is arranged to execute an additional program while the memory controller is arranged to execute an evaluation program; wherein an execution of the additional program is being evaluated by the evaluation program; wherein the memory controller is coupled to the multiple points of interest via multiple probes for receiving, during the execution of the evaluation program, captured signals from multiple points of interest; wherein the memory controller is arranged to transfer at least a portion of the captured signals to at least one memory space of a memory block via memory channels of the FPGA; and wherein the memory controller is arranged to optionally output at least a portion of the captured signals from the FPGA via a communication element, for example, to a Host computer.

The device may include at least forty points of interest. For example, the device may include at least 50 thousand points of interest.

The memory controller may be arranged to receive captured signals from at least forty eight points of interest and at a rate of at least sixteen bytes per cycle The aggregate size of the at least one memory space may exceed one gigabyte.

The memory controller may be arranged to receive predefined responses to triggers received by the memory controller.

The memory controller may be arranged to select captured signals to be stored in the memory block and select captured signals to be ignored of; the selecting is responsive to a stage of an evaluation process.

The memory controller may be arranged to select captured signals to be stored in the memory block and selecting captured signals to be ignored of; the selecting is responsive to previously obtained data or previously detected errors in an execution of the additional program by the FPGA.

The memory controller may be arranged to transfer at least a portion of the captured signals to at least one memory space of a memory block based on a mapping between memory channels of the memory controller and memory spaces of the memory block.

The memory controller may be arranged to receive at least one (possibly video related) control signal selected from a frame indication and a valid indication and storing (possibly video related) captured signals from at least one point of interest to the memory block.

The memory controller may be arranged to duplicate a captured signal to provide two duplicates of the captured signals, to transfer one duplicate of the captured signal to the memory block and to optionally output another duplicate of the captured signal from the FPGA via the communication element, for example, to a Host computer.

The memory controller may be arranged to receive a request from a user, for obtaining captured signals that have been captured at previous point in time that occurred at least one fraction of a second before the receiving of the request; and to optionally send to host computer the captured signals.

The memory controller may be arranged to receive a request from a user, for stopping an execution of the additional program; and ignore captured signals that have been stored before receiving the request by the memory controller of the FPGA but after the request has been issued by the user.

The memory controller may be arranged to tag captured signals and retrieving captured signals from the memory block based on values of tags associated with the captured signals.

BRIEF DESCRIPTION OF THE DRAWINGS

FIG. 6 illustrates a method according to an embodiment of the invention; and FIGS. 7-10 illustrates various screens displayed to a user according to various embodiments of the invention;

DETAILED DESCRIPTION OF THE DRAWINGS

Figure 1:
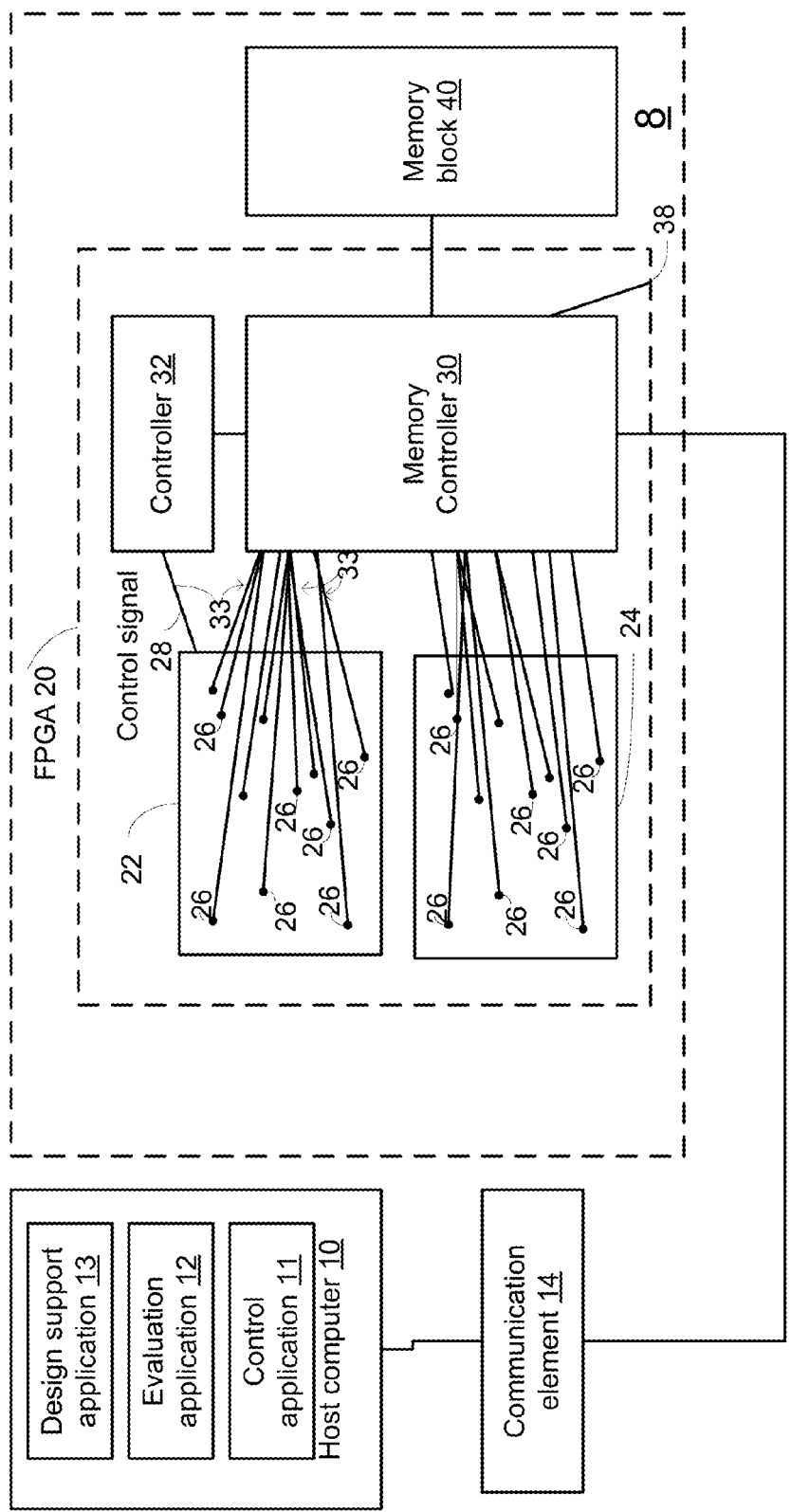
FIG. 1 illustrates a system that includes a memory, a Communication Element and an FPGA according to an embodiment of the invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The following text refers to an evaluation process. It is noted that the evaluation process may be a debugging process, a verification process, a quality evaluation process, a calibration process, an optimization process or any feedback based process.

The following text refers to an FPGA. It is noted that the methods and devices illustrated below can be applied mutatis mutandis on ASICs, System on Chip (SoC) or other programmable design integrated circuits.

An FPGA design includes multiple points of interest that can be probed to provide captured signals. The captured signals are sent via probes and a memory controller (included in the FPGA) to a memory.

The system can be used during various processes (or phases of the design process) including but not limited to FPGA design, verification and simulation stages, evaluation of systems that include FPGAs such as but not limited to SOC (System On a Chip), hardware accelerators that include one or more FPGAs, machine vision systems, mathematical simulators, and the like. The system can be used not only at the debug or simulation phases, but also during nominal or normal use in the field or at a customer site.

According to an embodiment of the invention the evaluation process can be adjusted according to user preferences. The configuration process can utilize a configuration graphical user interface (GUI) that can be provided by a control application that is hosted by host 10. The configuration process can also utilize an Application Programming Interface (API)

A configuration process can include determining which captured signals to send to the memory, how to react to triggers, which channels to be sent to the host for the evaluation application, which FIFOs will act as input FIFOs, which FIFOs will act as output FIFOs, how to transfer captured signals to the memory, what is the probing frequency for each signal, and the like. For example, a trigger can stop the writing of captured signals to the memory, can stop the capture of signals, can start the capture of signals by the probe, and the like. Yet for another example, a user can request to store captured signals of a certain type while ignoring captured signals of another type.

According to an embodiment of the invention the system can output captured signals in parallel to a provision of these captured signals to an external circuit such as but not limited to an evaluation circuit. The parallel operation may be facilitated by connecting one or more probes to the on-board memory as well as to data interfaces that are coupled to the evaluation circuit. The real time or almost real time provision of captured signals to an external circuit such as a host facilitates an evaluation process that is responsive to captured signals. The evaluation process can stop, continue, or issue a triggering signal in response to one or more captured signal or in response to a result of an analysis of one or more captured signals.

The memory can be large (for example a few gigabyte, few tens of gigabytes, 256 gigabytes or more) and then a vast amount of captured signals can be stored. This vast amount of captured signals can be obtained over a very long period of time and can be used for one or multiple evaluation processes. In ASIC prototyping applications this vast amount of captured signals is of prime importance. It is noted that the entire memory 40 can be used for storing the captured signals (for evaluation purposes), or a part of memory 40 can be used for the normal (nominal) applications while another part is allocated for the evaluation application. Accordingly—there may be no need to add memory for evaluation purposes.

Multiple triggers can be sent to the FPGA and the memory can store responses of the FPGA to multiple triggers thus facilitating an analysis of captured signals that are responsive to these multiple triggering signals.

The evaluation process utilizes already existing connections between the FPGA and the host and uses FPGA resources to control and apply the evaluation process. Accordingly, a product that is sold or otherwise provided to the customer has extensive evaluation capabilities. In addition, there is no need to add additional dedicated hardware (controller, memory, cables, connectors, probes, etc.) to the system and the evaluation process can be performed at the full operational speed of the FPGA.

The system allows a user or any other person to evaluate the FPGA even after the FPGA is shipped from the manufacturing facility and can provide a large amount of information that is being captured over long periods of times and from multiple points of interest—without using sophisticated and costly analysis tools.

Predefined triggers can be evaluated in real time, can be programmed to be very complex and can be changed by altering the definitions provided to the memory controller and without compiling the entire FPGA data base.

Captured signals can be stored in the memory module for a long period—even after the FPGA is re-configured.

FIG. 1 illustrates system 8 that includes a memory (denoted "memory block") 40, communication element 14 and FPGA 20, according to an embodiment of the invention The system 8 is connected via communication element 14 to host 10. Host 10 hosts various applications such as evaluation application 12 and control application 11. Evaluation application 12 can retrieve captured signals from various points of interest within FPGA 20, process the captured signals to provide evaluation results, display captured signals, send the captured signals to other applications and, additionally or alternatively display the evaluation results, allow a user to send evaluation commands (such as stop, retrieve information, repeat an execution of commands), can instruct FPGA 20 to stop a evaluation sequence and the like. A user can interact with FPGA 20 via host 10. The processing can include decrypting ciphered signals FIG. 1 also illustrates host computer 10 as hosting a design support application 13. The design support application 13 may assist in the design process. The design support application 13 can provide an interface to a designer, can convert design information provided by a user to FPGA programming commands, may generate design files and the like.

For example, the design support application 13 may generate C++ Class application drivers for incorporation with the evaluation application 12. The design support application 13 may generate top level design and interface module/entity for each FPGA and program the FPGA accordingly. Yet for another example, the design support application 13 may perform hardware initialization; may load FPGA and the like.

The host computer 10 can include a man machine interface (MMI) such as a display, a keyboard, a mouse and the like. The MMI can be used to display outcomes of the evaluation process, can be used to receive commands from the user and the like.

Figure 7:
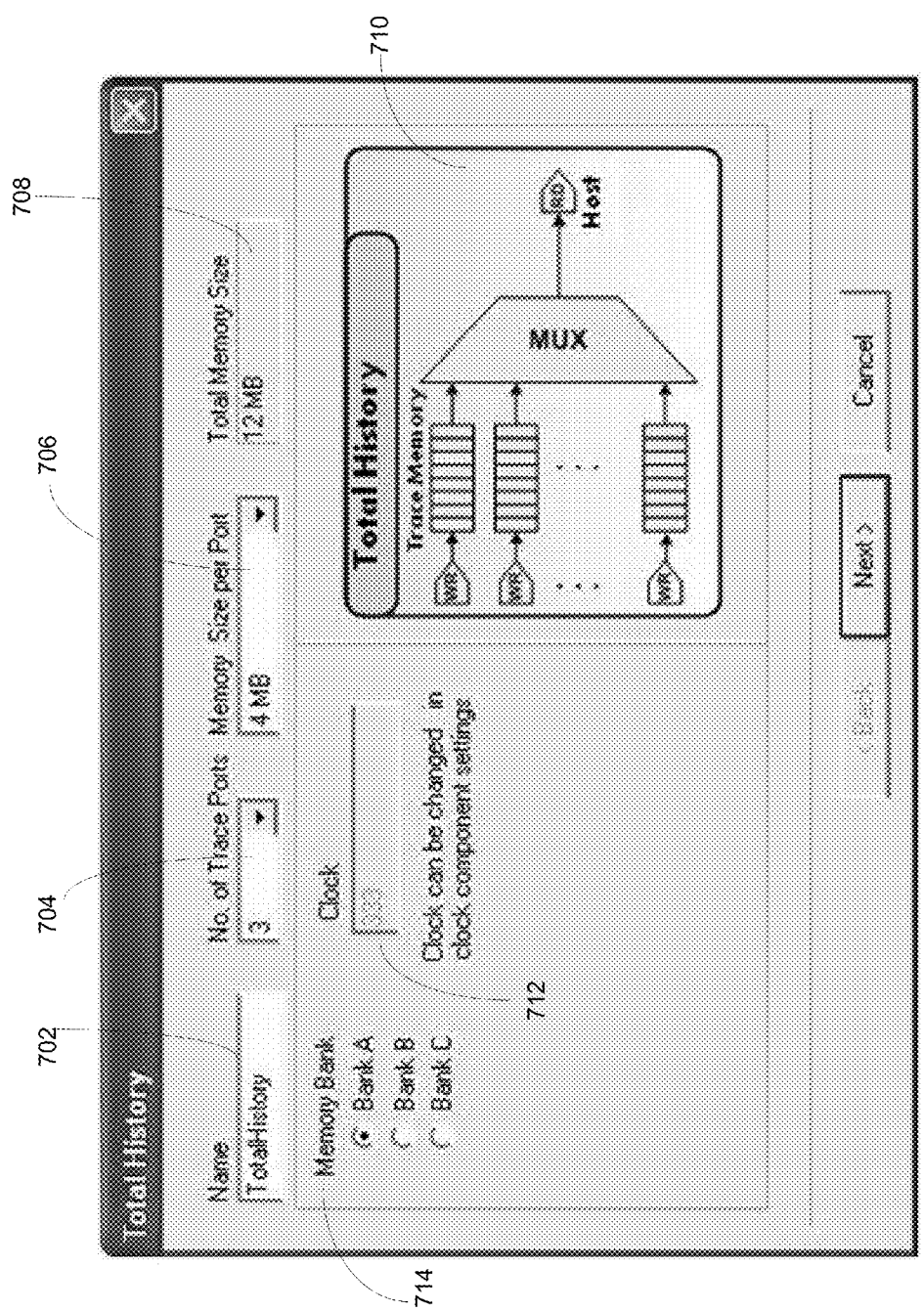

FIG. 7 illustrates a sample of a screen 700 that is displayed to a user according to an embodiment of the invention. In this figure memory channels are referred to as ports.

The host computer 10 allows the user to elect a number of memory channels (referred to as trace ports in field 704), to elect a memory space allocated for each port (field 706), and to elect which memory space to allocate. The screen 700 also displays a total size of memory space allocated (field 708), a clock signal frequency that determines the sampling frequency (field 712) and a schematic image 710 of multiple ports that are connected via a multiplexer to the host computer 10. The screen 700 also indicates that the application that is being configured is related to the evaluation application 12 (also referred to as "total history").

Figure 8:
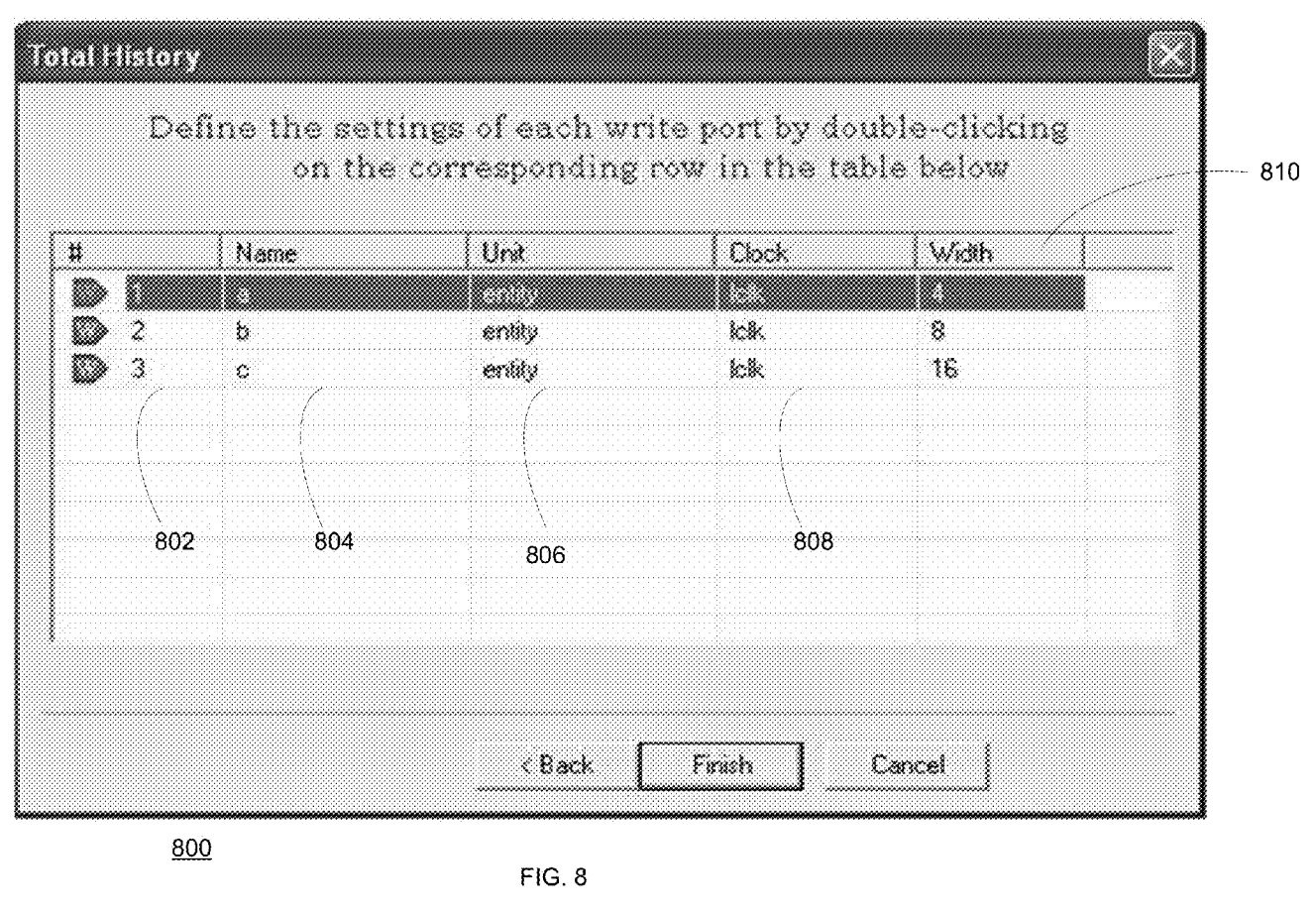

FIG. 8 illustrates a sample of a screen 800 that is displayed to a user and allows the user to set each memory channel (referred to as port). Screen 800 includes a table in which each memory channel is characterized by a row that may include the identity of the port (column 802), the name of the port (column 804), the unit (part of logic 24 or 26) that is sampled by the port (column 806), the name of the clock signal used for sampling (column 808) and a width of the port (column 810).

Figure 9:
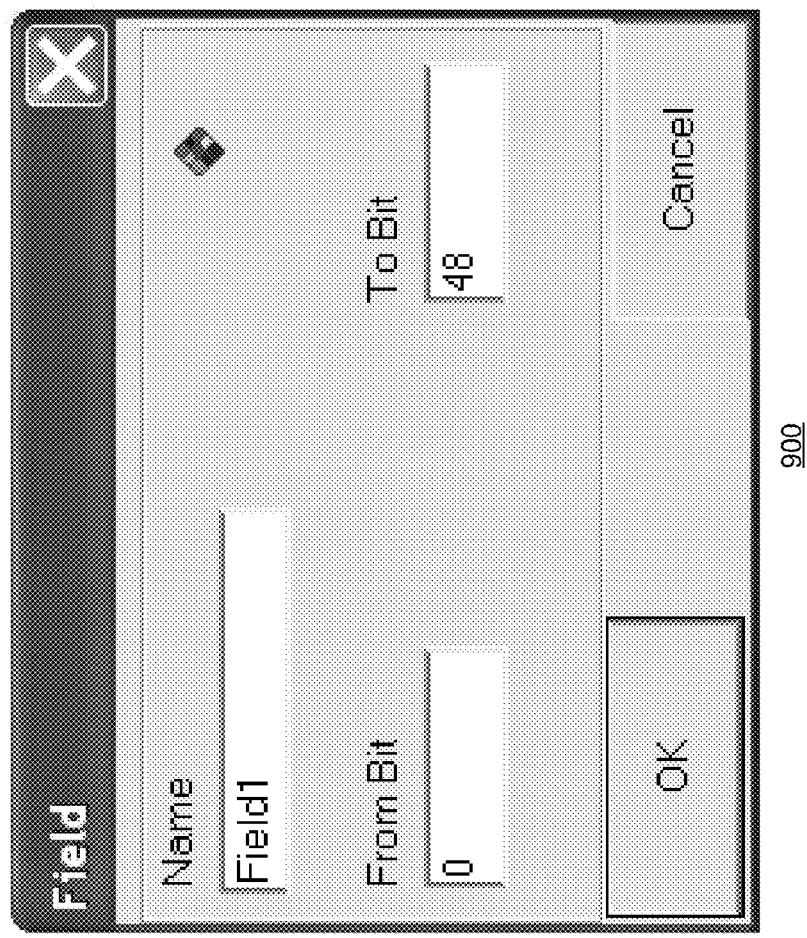

It is noted that each point of interest of each memory channel (port) can also be configured. FIGS. 9 and 10 illustrate screens 900 and 1000 that allow to define different points of interest (probes)—that are referred to as fields. For example, if a certain port is 128 bits wide these 128 bits can be allocated between different probes as shown in FIG. 10. FIG. 9, for example, illustrates the allocation of bits 0 to 48 to a field, i.e., a probe, designated Field1.

The memory block 40 of device 8 can operate at a higher rate than the memory controller 30 and thus can both receive captured signals and output captured signals without interfering in the sampling process of the captured signals.

Communication element 14 can be a PCI Bridge, an Ethernet Controller, another Interface, or may even not be needed at all. It can include a communication medium such as a bus, multiple buses, PCI bus, Ethernet, the Internet, and the like.

Communication element 14 connects FPGA 20 to the Host 10 via a communication medium. It is noted that other interfacing circuits can be used and that Communication element 14 is only an example of such an interfacing circuit. For example, FPGA 20 can be connected to a Printed Circuit Board (PCB) that has one or more connectors that provide connectivity between host 10 and FPGA 20. The connectivity can utilize various communication protocols such as Ethernet but this is not necessarily so. FPGA 20 and memory 40 can be connected to the same PCB. Memory 40 may be an on board memory. Memory (denoted "memory block") 40, communication element 14 and FPGA 20, can all reside on the same PCB. It is noted that a single PCB can include multiple FPGAs and multiple memories.

It is noted that although FIG. 1 illustrates a single controller, single memory module and a single memory controller per a single FPGA, this is not necessarily so and multiple memory controllers, memory modules and/or controllers can be allocated per FPGA. Different memory controllers can cooperate or operate independently from each other. Different memory controllers can be coupled to different logics or to the same logic of the FPGA, can share a memory module or use different memory modules, can communicate by the same communication interface or via different communication interfaces.

FPGA 20 is programmed to fulfill one or more tasks such as mathematical calculation acceleration, video processing, routing, data packet processing, machine vision processing and the like. These tasks or functions are referred to as "nominal" or "normal" functions and are implemented by logic circuits in FPGA 20, such as logics 24 and 22. "Normal" tasks may differ from the evaluation of FPGA 20. Logics 22 and 24 are also referred to as cores of intellectual property (IP).

FPGA 20 is designed to include one or more logics (such as logics 22 and 24), controller 32, memory controller 30. Logics 22 and 24 can be video processors, video accelerators, data processors, and the like.

Multiple points of interest 26 may be defined in each of these logics. FIG. 1 also illustrates a point of interest 38 that is connected to a pin of FPGA 20 in order to receive signals from a component of system 8 that differs from FPGA 20. Although FIG. 1 illustrates six points of interest 26 (three from each logic 22 and 24) and a single "external" point of interest 38 it is noted that the number of points of interest can differ from seven. For example, the number of points of interest can exceed forty, one thousand and can even exceed 50,000. It is further noted that the number of points of interest of logic 22 can differ from the number of points of interest of logic 24.

The points of interest 26 and 38 are coupled via probes 33 to memory controller 30 and controller 32. A probe can include a sampling circuit, a multiplexer, logic gates, small memory, and the like.

The number of points of interest is selected during the design stage of the FPGA. This may be done after the design of the nominal logic, as part of the evaluation phase, depending on what the user is looking for. More points of interest may provide more detailed information about the FPGA but may require more memory controller channels, more memory bandwidth and more memory space. It is noted that FPGA 20 may be dynamically configured to select captured signals from certain points of interest while ignoring captured signals from other points of interest. The selection can be responsive to user preferences, stage of the evaluation process, errors or possible errors detected from signals provided from a point of interest and the like.

Points of interest 26 are connected via probes (illustrates as lines in FIG. 1) to memory controller 30. It is noted that each probe may be connected to a channel of memory controller 20. A probe can be a conductor, can include memory elements, can be connected to memory elements, can include logic gates, can include a selection unit or can be connected to selection unit, and the like. It is further noted that a probe can have a configurable throughput. A probe can include some of the components of a memory controller channel such as FIFO, logic and the like.

Memory controller 30 is connected to controller 32 and to memory 40. Memory 40 can include one or more memory chips or a portion thereof. It can include multiple memory banks.

FPGA 20 can include multiple memory controllers that are connected to multiple memories but for simplicity of explanation FIG. 1 only illustrates a single pair of memory 40 and memory controller 30.

Controller 32 participates in an evaluation process by controlling the storage and, additionally or alternatively, a retrieval of captured signals obtained from points of interest.

Controller 32 controls memory controller 30 by performing at least one of the following operations: (i) sending memory controller 30 memory mapping information indicative of mapping between memory controller channels and memory spaces of memory 40; (ii) sending control signals (such as "Valid" control signal, "Frame indication" control signal, "Data indication" control signal and the like) indicative of when to store captured signals that are sent to the channels of memory controller, (iii) sending reset signals, (iv) sending channel information indicative of which channels of memory controller 30 are allocated for storing or retrieving points of interest information. It is noted that memory controller 30 can be controlled by more than a single controller.

Figure 2:
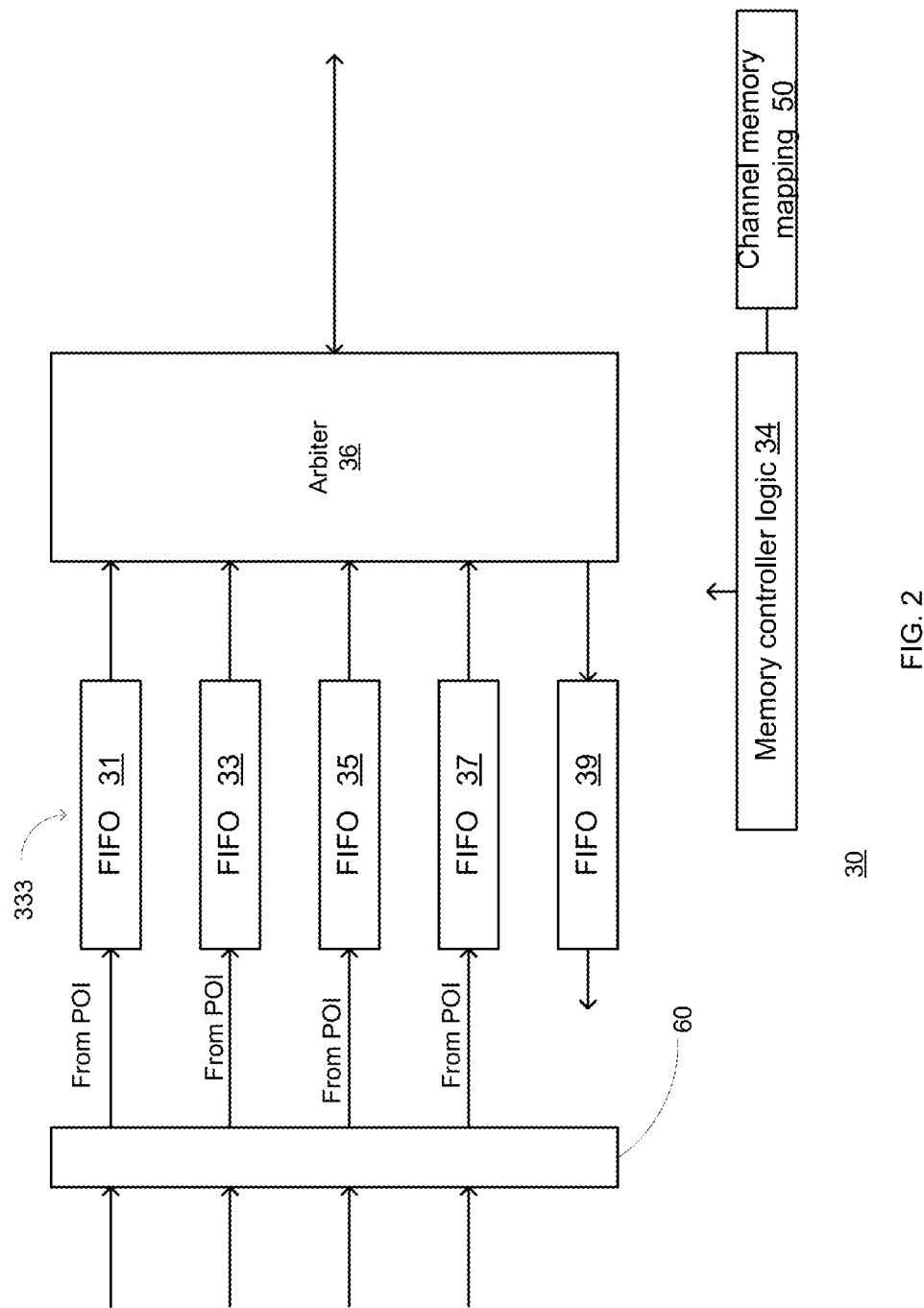
FIG. 2 illustrates a memory controller of the FPGA according to an embodiment of the invention.

By mapping different memory spaces to different memory controller channels captured information from one point of interest does not overwrite captured information from another point of interest. Typically the size of memory spaces is selected to facilitate storage of point of interest information for a desired period of time. By using a large memory, the desired period of time can be very long—virtually unlimited for evaluation purposes. In FIG. 2 the memory mapping information is illustrated as "channel memory mapping 50".

Control signals are usually sent from logic 22 or logic 24 to describe the information that is being outputted by these logics. If, for example, logics process video frames they may output control signals such as Valid and Frame indication but this is not necessarily so. A Valid control signal indicates when a point of interest captures valid captured signals. A Frame indication may indicate a start of a logical frame (or other significant point in time associated with a logical frame). A logical frame can be, for example, a video frame (part of a video stream), or a communications packet (received from a communication channel). It is noted that the captured signals other than video can be arranged in frames, packets, or other data structures and can be accompanied with various control signals that may be also detected and/or processed by the memory controller.

It is noted that a single control signal (or a single set of control signals) can indicate when to sample captured signals from one or more probes. For example, a frame indication and a valid indication can trigger storage of captured signals from multiple points of interest. Accordingly, not every point of interest may have its own control signals and multiple channels of the memory controller can be controlled by the same control signals or the same set of control signals.

It is noted that controller 30 can receive a control signal and generate derivative control signals by performing logic operations, time shifting control signals and the like.

A reset signal can clear a memory controller channel and can also be used to either clear a memory space associated with a channel of the memory controller or to assist in overwriting the content of that memory space. The latter can be achieved by setting a write pointer of a channel to the beginning of the memory space.

The allocation of memory controller channels that will take part in the evaluation process can be made by a user (via host 10) but can also be done automatically while taking into account memory controller channels that are allocated for non-evaluation tasks such as "nominal" operation of the FPGA 20 (these "normal" operation may also be referred to as additional operations or additional programs). By allocating memory controller channels for non-evaluation purposes system 8 can maintain its "normal" (or "nominal") operation and also perform evaluation.

By allocating memory controller channels that are not used for "normal" (or "nominal") operation for evaluation purposes, system 8 can maintain its "normal" (or "nominal") operation and also perform evaluation.

Controller 30 can decide which points of interest to sample based upon the number of vacant memory controller channels, and selection parameters such as a priority of points of interest, which logic of FPGA is active (or should be evaluated) and the like. Referring to FIG. 2, interconnecting circuit 60 of memory controller 30 can elect which points of interest (or other signals providers) are sent to channels of memory controller 30. The interconnecting circuit 60 can include multiplexers, logic gates, and the like.

Memory controller 30 may receive multiple captured signals at real time and at a full operating frequency of logics 22 and 24 and can also send in real time captured signals via Communication element 14 to host 10. Captured signals from one or more points of interest can be received by one or more memory controller channels and sent to memory and to host 10 in real time. Accordingly, while capture signals are stored in memory 40 some of them are also sent to host 10. This dual operation can be implemented by allocating a first memory controller channel to send captured signals to memory (operate as an input channel) and allocating another memory controller channel to send these captured signals to host (operate as an output channel). According to an embodiment of the invention captured signals are stored in memory 40 and then are sent to the output channel, for example, to a Host computer.

According to another embodiment of the invention the captured signals are duplicated in an interconnecting logic 336 of memory controller that includes a bypass circuit 338. Bypass circuit 338 has an input for receiving captured signals and two outputs that send captured signals and duplicated signals to memory 40 and to the output memory channel.

It is noted that the link between memory controller 30 and memory 40 can have a higher and even much higher throughput than the links between points of interest and memory controller so that sampled signals can be written to memory 40 and read from memory 40 to the output channel while the input channel is fed by other captured signals.

Those of skill in the art will appreciate that the throughput differences can be attributed to clock signal frequency, bus width or a combination thereof. For example, if there are K channels then in order to obtain a full parallel operation (with all K channels) the throughput of link 44 between memory 40 and memory controller 30 should be at least K times higher than the throughput of the slowest memory channel.

FIG. 2 illustrates memory controller 30 according to an embodiment of the invention. Memory controller 30 includes interconnecting circuit 60, multiple memory elements such as but not limited to first in first out buffers (FIFOs) 31, 33, 35, 37 and 39, arbiter 36, memory controller logic 34 and a memory element that stores memory mapping information as is denoted channel memory mapping 50. It is noted that the number of FIFOs can differ from five and is usually bigger and even much bigger than five. Non-limiting number of FIFOs include sixteen, thirty two, forty eight, sixty four, one hundred twenty eight and the like.

Memory controller 30 is configured to manage multiple channels. Each channel is associated with a transfer of data (such as but not limited to captured signals) from memory 40 or to memory 40. The channels can be mutually independent.

A memory controller channel includes a FIFO and associated logic. For simplicity of explanation the different logics of the different channels are not shown as they are included in memory controller logic 34. The logic of each channel can maintain a pointer ("start pointer") to a start address of a memory space allocated to the channel, can maintain a pointer ("updated pointer") to the next memory entry to be written to or a combination thereof. Each channel logic can prevent invalid data to be sent to FIFO or from the FIFO to memory 40. Additionally or alternatively, interconnecting circuit 60 can prevent the writing of invalid data to the FIFOs.

Arbiter 36 is connected to each of FIFOs 31, 33, 35, 37 and 39 and selects which FIFO is connected to link 44. Arbiter 36 can apply any prior art time division multiplexing algorithm. It can receive (for example from host 10) arbitration scheme information that determines how to arbitrate between the different channels. Non limiting of arbitration schemes include round robin, weighted round robin, sequential arbitration, starvation prevention arbitration schemes, priority related arbitration schemes and the like.

Figure 3:
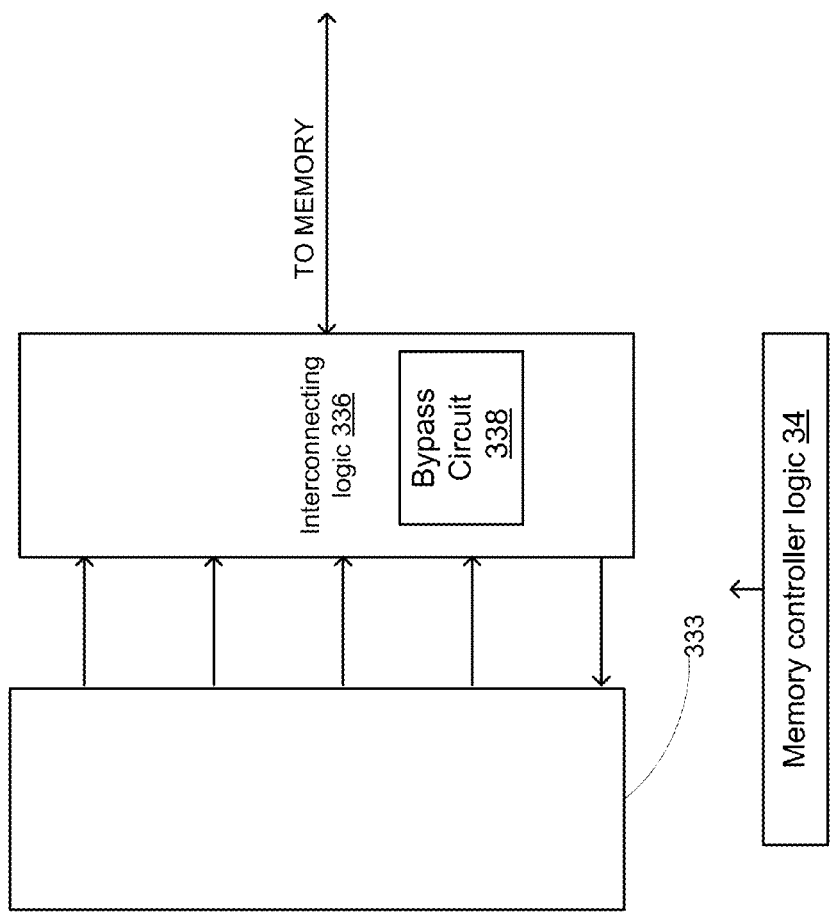
FIG. 3 illustrates a memory controller of the FPGA according to another embodiment of the invention.

FIG. 3 illustrates memory controller 20' of the FPGA according to another embodiment of the invention. Memory controller 20' includes interconnecting circuit 336 that includes a bypass circuit 338 that allows one or more input FIFOs to be connected to one or more output FIFOs and also to memory 40 thus allowing a duplication of captured signals and output these signals to host 10 while sending these signals to memory 40.

According to an embodiment of the invention captured signals can be tagged by one or more tags. These tags can be stored at the memory and can be accessed during the retrieval of captured signals. A tag can indicate, for example, a type of captures signal—for example whether it is a data signal, a video signal, a control signal, a frame delimitation signal and the like. Captured signals can be selectively retrieved by using these tags. Non-limiting example of tags can be video frame tag, data packet tag and the like.

According to an embodiment of the invention timestamps may be associated with captured signals. The timestamps can be generated by a probe, by a time stamp circuit that is utilized by multiple probes and the like. A timestamp can indicate when a signal was captured or at least provide an indication about a time window in which the signal was captured. Additionally or alternatively, a timestamp can indicate a triggering signal that triggered to capture of the signal.

Figure 4:
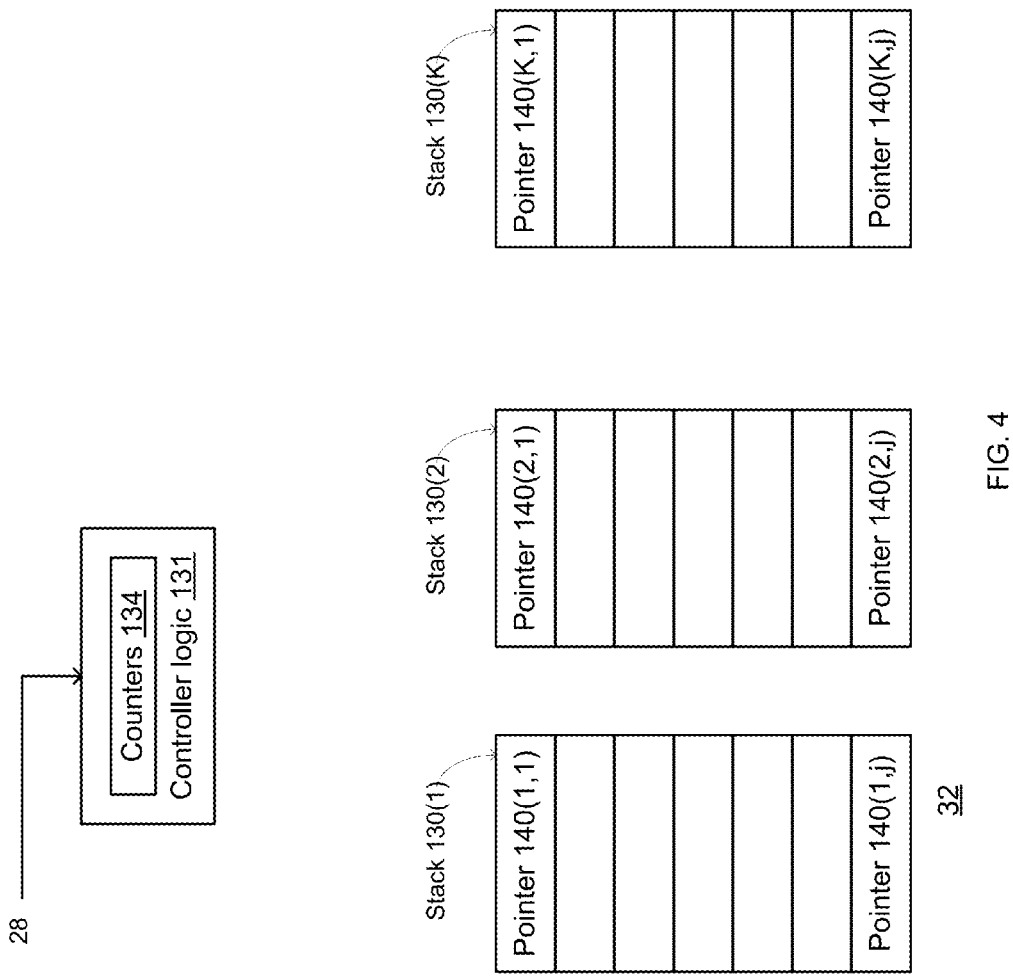
FIG. 4 illustrates a controller of the FPGA according to an embodiment of the invention.

FIG. 4 illustrates controller 32 of FPGA 20 according to an embodiment of the invention.

Controller 32 includes controller logic 131 and multiple stacks 130(1)-130(K). Controller logic 131 receives control signals 28 from logics 22 and 24 and, additionally or alternatively from host 10. In response to these control signals it can send to memory controller 30 instructions that determine when to store signals provided from points of interest, can select which points of interest will be ignored of and can maintain pointers to groups of captured signals.

A group of captured signals can be a video frame, a group of pictures, a data packet, a data frame and the like. Each stack stores a set of pointers to memory that point to different groups of captured signals of a single channel. In general, the j'th pointer of the k'th stack points to the j'th group of captured signals of the k'th channel. For example, stack 140(1) stores pointers 140(1,1)-140(1,J) to up to J different groups of captured signals of the channel associated with stack 140 in memory. The pointers point to entries of memory 40.

These stacks facilitate a fast retrieval of information of interest. For example, if there is a need to send a certain frame to host 10, the appropriate stack can be scanned, and the appropriate pointer can be utilized for obtaining that frame to host 10.

Controller 32 can generate a pointer when it receives Frame and Valid indications. The value of the pointer should equal the address of the memory entry (of memory 40) to which the frame is being written. Controller 32 can track after the progress of writing of each channel (controller 32 can have its own counters—such as counters 134) or can retrieve the information from memory controller logic 34.

According to an embodiment of the invention timestamps may be associated with captured signals. The timestamps can be generated by a probe, by memory controller 30, by controller 32 or by another timestamp circuit. A timestamp can indicate when a signal was captured or at least provide an indication about a time window in which the signal was captured. Additionally or alternatively, a timestamp can indicate a triggering signal that triggered to capture of the signal.

Conveniently, the fast capturing of signals and the ability to store a large number of captured signals in memory 40 facilitates extensive analysis of FPGA 20, and especially allows tracking after signals captured during relatively long periods of time.

A user can request to stop the execution of a program that is being executed by FPGA 40 and is also being evaluated. Additionally or alternatively, the user can request to trigger. The request can arrive at a significant (and even long or unpredictable) delay to controller 32 after an interesting event (from evaluation point of view) occurred. This delay does not hamper the evaluation process because captured signals that were stored at memory 40 even long time before the request can be retrieved and sent to evaluation application 12.

Evaluation application 12 can send evaluation commands to FPGA 20 and control the evaluation process.

Figure 5:
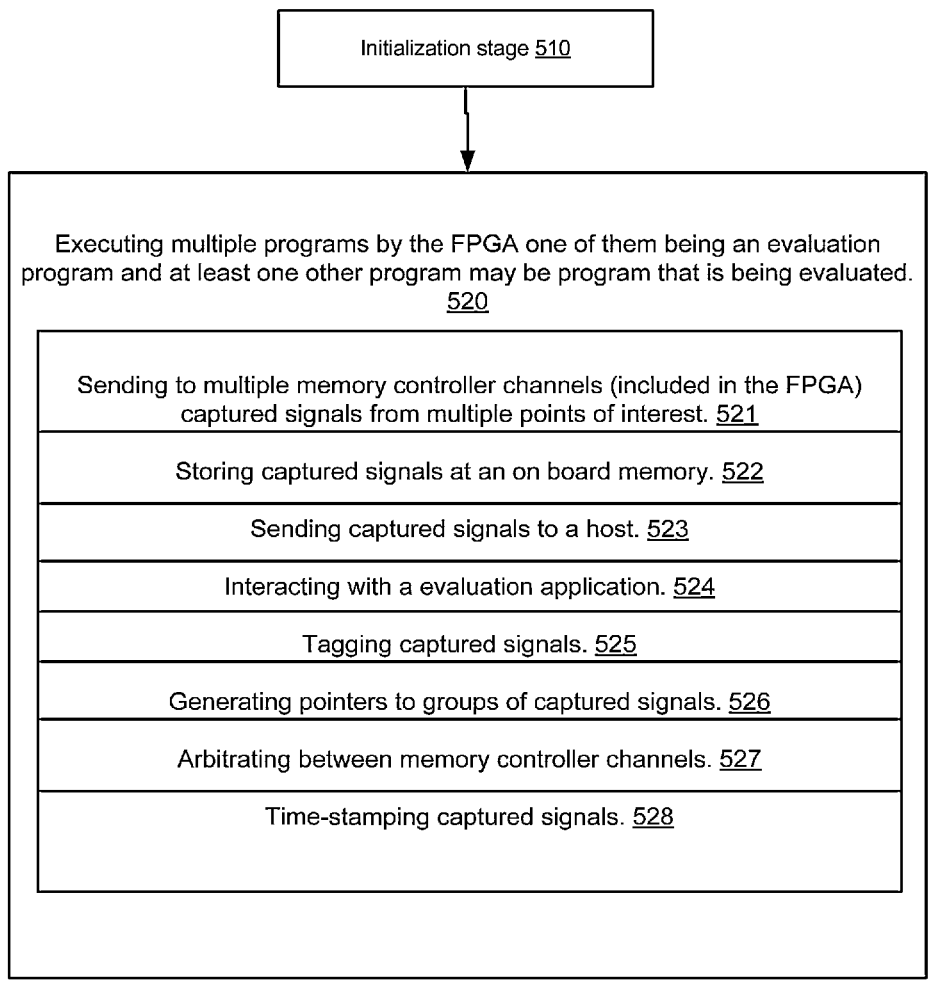
FIG. 5 illustrates a method according to an embodiment of the invention.

FIG. 5 illustrates method 500 according to an embodiment of the invention.

Method 500 can be executed by system 8 and especially by FPGA 20.

Method 500 starts by initialization stage 510. This stage can include loading one or more evaluated program to FPGA 20, loading the evaluation program to FPGA 20, resetting memory controller channels, receiving mapping information indicative of mapping between memory controller channels and memory spaces of memory, determining which FIFOs to allocate for the evaluation process and out of those FIFOs which will act as input FIFOs and which will act as output FIFOs, selecting which points of interest to monitor, and the like.

Stage 510 is followed by stage 520 of executing multiple programs by the FPGA one of them being an evaluation program and at least one other program may be program that is being evaluated. Stage 520 may include executing the programs at the full operational speed of the FPGA or at an execution speed that such programs were to be executed at the absence of the evaluation program. Alternatively, stage 520 may include executing the programs at a lower speed, and even much lower speed than the execution speed that such programs were to be executed at the absence of the evaluation program.

Stage 520 includes at least one of the following stages: (i) stage 521 of sending to multiple memory controller channels (included in the FPGA) captured signals from multiple points of interest, (ii) stage 522 of storing captured signals at an on board memory, (iii) stage 523 of sending captured signals to host 10, (iv) stage 524 of interacting with a evaluation application, (v) stage 525 of tagging captured signals, (vi) stage 526 of generating pointers to groups of captured signals, (vii) stage 527 of arbitrating between memory controller channels, (viii) stage 528 of time-stamping captured signals.

Stage 522 and even stage 521 can be conditioned by receiving a valid indication, receiving a frame (or data packet) indication and the like.

Stage 524 can include receiving a user command to start the evaluation, stop the evaluation, resume the evaluation, change an execution mode of a program that is evaluated, retrieve certain captured signals, retrieve captured signals related to a certain time window, and the like.

The methods and/or processes may be implemented as a computer readable medium having a computer readable code embodied therein, the computer readable code including instructions for the carrying out of at least one of the above disclosed methods and processes.

FIG. 6 illustrates method 600 according to an embodiment of the invention.

Method 600 can be executed by system 8 and especially by FPGA 20.

Method 600 starts by stage 610 of configuring the FPGA to execute, in parallel, an evaluation program and an additional program; wherein an execution of the additional program is being evaluated by the evaluation program. In a nut shell, stage 610 may include determining which captured signals to send to the memory, how to react to triggers, which channels to be sent to the host for the evaluation process and which to allocate to "nominal" processes, which FPGA memory controller memory channels will act as input memory channels, which will act as output memory channels, how to transfer captured signals to the memory, what is the probing frequency for each captured signal, and the like.

Stage 610 may include at least one out of stages 620, 630 and 640.

Stage 620 includes sending to the memory controller of the FPGA predefined responses to triggers received by the memory controller of the FPGA. Non-limiting examples of the predefined responses may include: (i) storing an outcome of an execution of a predefined response to a trigger at the memory block and outputting the outcome; (ii) storing captured signals of a certain type while ignoring captured signals of another type; (iii) stopping a capture of captured signals from a point of interest; (iv) starting a capture of captured signals from the point of interest; (v) altering a probing scheme that determined how signals are being captured, or which signals are being captured—changing points of interest, changing a sampling rate of captured signals, changing a width of points of interest and the like.

Stage 630 includes selecting captured signals to be stored in the memory block and selecting captured signals to be ignored of; wherein the selecting is responsive to a stage of an evaluation process.

Stage 640 include selecting captured signals to be stored in the memory block and selecting captured signals to be ignored of; wherein the selecting is responsive to previously obtained data or previously detected errors in an execution of the additional program by the FPGA.

Stage 610 is followed by stage 650 of executing, by the FPGA the evaluation program and the additional program.

Stage 650 of executing includes at least one out of stages 660, 665, 670, 680, 685 and 690.

Stage 660 includes receiving, by a memory controller of the FPGA, captured signals from multiple points of interest of the FPGA. The captured signals can be received at a high rate from many points of interest. For example, the number of points of interest may be at least forty and the rate of reception of the data per each point of interest may be at least sixteen bits per clock cycle.

Stage 665 includes processing the captured signals. The outcome of the processing can be stored in the memory block, can be outputted from the FPGA, can be retrieved from the memory block and the like. The processing may include decoding encoded captured signals, decrypting ciphered captured signals and the like.

Stage 670 includes transferring, by the memory controller of the FPGA, at least a portion of the captured signals to at least one memory space of a memory block, via memory channels of the FPGA. The captured signals can be stored in one or more memory spaces of the memory block. The aggregate size of these one or more memory spaces memory block can exceed few megabytes, few tens of megabytes, few hundred of megabytes, few gigabytes, and even more. Accordingly a large amount of captured signals can be stored from a very long period of time and from a large number of points of interest.

Stage 680 includes outputting, by the memory controller of the FPGA, at least a portion of the captured signals from the FPGA via a communication element, for example, to a Host computer. Stage 680 may include retrieving captured signals from the memory block and outputting the retrieved captured signals to a host computer or to one or more another components located outside the FPGA.

Stage 670 may include transferring, by the memory controller of the FPGA, at least a portion of the captured signals to at least one memory space of a memory block based on a mapping between memory channels of the memory controller and memory spaces of the memory block.

Stage 685 includes receiving, by the memory controller of the FPGA, at least one video related control signal selected from a frame indication and a valid indication and storing (video related) captured signals from at least one point of interest to the memory block. It is noted that stage 680 can include receiving control signals that are related to frames or other data structures that differ from video frames.

Stage 690 includes duplicating, by the memory controller of the FPGA, a captured signal to provide two duplicates of the captured signals. Stage 670 may include transferring, by the memory controller of the FPGA, one duplicate of the captured signal to the memory block and stage 680 may include outputting, by the memory controller of the FPGA, another duplicate of the captured signal from the FPGA via the communication element, for example, to a Host computer.

Stage 660 may include receiving commands or requests from a user.

For example, stage 660 may include receiving a request from a user, for obtaining captured signals that have been captured at previous point in time that occurred at least one fraction of a second before the receiving of the request.

In such a case stage 680 may include sending to a host computer the captured signals. The user can detect an event (such as an error in a video image) and may wish to obtain captures signals that were generated during the event or before the event. The user may respond to the event at a certain delay (for example—after a fraction of a second or after one or more seconds). The request is generated by a host computer that executed an evaluation program that may assign a time stamp or other identifying information to the request of the user. The time stamp is used to retrieve the relevant captures signals that may be already sent to the memory block or stored in the memory controller.

For example, stage 680 may include receiving a request from a user, for stopping an execution of the additional program; and ignoring captured signals that have been stored before receiving the request by the memory controller of the FPGA but after the request has been issued by the user.

Yet for another example, stage 680 may include receiving a request from a user, for obtaining captured signals that have been captured at previous point in time that occurred at least one fraction of a second before the receiving of the request; and sending to a host computer the captured signals.

The processing may include tagging captured signals. These tagged captures signals may be retrieved from the memory block based on values of tags associated with the captured signals.

The system illustrated in the previous figures can be characterized by the following characteristics: captures any FPGA internal signals and nodes including embedded processor, busses and IPs; provide a direct interface to user's debugged application; the probing does not require additional HW/logic overhead; uses practically unlimited memory capture (for example—memory block 40 can be at least 4 GB); provides scalable ultra deep sampling depth; provides embedded real-time probing at design's full operating speed; supports flexible triggering thus allowing selective tracing; uses API methods for user application; utilizes PROCWizard automatic user application generator; includes a flexible clocking system; may be supported by GiDEL's PROCDeveloper's Kit; accelerates or expedites debugging process to minutes/hour; PROCWizard software intuitive GUI to define and configure multiple probe IPs within the user's design; includes minimum pin impact for debug, letting you free up pins for the rest of your design.

Reconfigurable FPGA designs enable extremely flexible and powerful parallel processing architecture, yet have been somewhat impeded by a lack of evaluation visibility. The complexity of today's design makes it almost impossible to debug a design using traditional logic analysis methods. Evaluation often captures over 50% of the development time. Thus, an efficient flexible debugging tool that is founded on accurate signal capture and abundant visibility depth is essential to accelerating/optimizing the developmental cycle.

The system illustrated in the previous figures may be used as a signal tracing tool for Altera FPGA based GiDEL PROC Boards enabling to trace any of the design signals while providing practically unlimited signal probing depth readily available to the user's choice of debugging/verification tools.

The probes 33 illustrated above may form multi-probe IP cores that are embedded into the user's design. These probes, inserted in any design point of interest, may capture signals at full system speed and output them from the on-board memory (memory block) via a communication element 14 such as a PCI/e bridge to the user's debug application hosted on host computer 10. Each FPGA IC can work with multiple (for example 48) fully configurable parallel virtual probes, each with a multiple (for example 16) bytes per cycle bandwidth. Probe trace memory is virtually unlimited with up to 4 GB SODIMM memory per IC, thus enabling virtually infinite signal tracing regression to accurately reproduce bugs.

The system may be used for various applications such as but not limited to ASIC prototyping, machine vision and algorithm validation.

The system can be a part of various development environments such as but not limited to GiDEL's fully integrative FPGA development platform that includes GiDEL's line of PROC Boards and the PROCDeveloper's Kit software package.

The PROCDeveloper's Kit, an intuitive design and debug environment, facilitates design development effort and enables simple straightforward insertion of the mentioned above IP Probes. The kit contains a design support application 13 such as PROCWizard™, the system illustrated above, Quartus and USBBlaster, and a PROCHIL™ option.

The PROCWizard performs hardware initialization and automatically generates the following: interface documentation in HTML or Microsoft Word; C++ classes application drivers enable simultaneous accesses of multiple applications, each to its dedicated section of the PROC board; top-level designs, interface modules/entities and on-board memory controllers for the application use; device constraints (as pin-outs).

The illustrated above system allows for simultaneous access to multiple parts of the FPGA design at variable clock frequencies. At the same time it enables parallel access to the on-board and SODIMM memories while enabling to split the physical memory into multiple logical memories. As a result the system provides a flexibility to set probes at any desired design point; a flexibility to trigger control each individual probe; virtually unlimited trace history memory; selective visibility depth and it may provide a replacement for the need for inventory of special memories by using standard memory and IP.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for evaluation a field programmable gate array (FPGA), the method comprising:
    configuring the FPGA to execute, in parallel, an evaluation program and an additional program; wherein an execution of the additional program is being evaluated by the evaluation program; and
    executing, by the FPGA the evaluation program and the additional program;
    wherein the executing comprises:
        receiving, by a memory controller of the FPGA, captured signals from multiple points of interest of the FPGA; and
        transferring, by the memory controller of the FPGA, at least a portion of the captured signals to at least one memory space of a memory block via memory channels of the FPGA;
        tagging captured signals; and
        retrieving captured signals from the memory block based on values of tags associated with the captured signals.

2. The method according to claim 1, further comprising outputting, by the memory controller of the FPGA, at least a portion of the captured signals from the FPGA via a communication element; and wherein the tags are indicative of a type of the captured signals.

3. The method according to claim 1, wherein the multiple points of interest comprise at least forty points of interest.

4. The method according to claim 1, comprising receiving captured signals from at least forty eight points of interest and at a rate of at least sixteen bytes per cycle.

5. The method according to claim 1, wherein a width of a single point of interest exceeds ten thousand bits.

6. The method according to claim 1, wherein a number of points of interest exceeds fifty thousand.

7. The method according to claim 1, wherein an aggregate size of the at least one memory space exceeds one gigabyte.

8. The method according to claim 1, wherein the configuring comprises sending to the memory controller of the FPGA predefined responses to triggers received by the memory controller of the FPGA.

9. The method according to claim 8, wherein a predefined response comprises storing an outcome of an execution of a predefined response to a trigger at the memory block.

10. The method according to claim 8, wherein a predefined response comprises storing captured signals of a certain type while ignoring captured signals of another type.

11. The method according to claim 8, wherein a predefined response comprises either stopping a capture of captured signals from a point of interest or starting a capture of captured signals from the point of interest.

12. The method according to claim 1, wherein the configuring comprises selecting captured signals to be stored in the memory block and selecting captured signals to be ignored of; wherein the selecting is responsive to a stage of an evaluation process.

13. The method according to claim 1, wherein the configuring comprises selecting captured signals to be stored in the memory block and selecting captured signals to be ignored of; wherein the selecting is responsive to previously obtained data or previously detected errors in an execution of the additional program by the FPGA.

14. The method according to claim 1, comprising transferring, by the memory controller of the FPGA, at least a portion of the captured signals to at least one memory space of a memory block based on a mapping between memory channels of the memory controller and memory spaces of the memory block.

15. The method according to claim 1, comprising receiving, by the memory controller of the FPGA, at least one video related control signal selected from a frame indication and a valid indication and storing captured signals from at least one point of interest to the memory block.

16. The method according to claim 1, comprising duplicating, by the memory controller of the FPGA, a captured signal to provide two duplicates of the captured signals; transferring, by the memory controller of the FPGA, one duplicate of the captured signal to the memory block and outputting another duplicate of the captured signal from the FPGA via a communication element and not through the memory block.

17. The method according to claim 1, comprising receiving a request from a user, for stopping an execution of the additional program; and ignoring captured signals that have been stored before receiving the request by the memory controller of the FPGA but after the request has been issued by the user.

18. The method according to claim 1, comprising receiving a request from a user, for obtaining captured signals that have been captured at previous point in time that occurred at least one fraction of a second before the receiving of the request; and sending to a host computer the captured signals.

19. The method according to claim 1, wherein the tags are indicative of whether the captured signals are data signals, video signals, control signals or frame delimitation signals.

20. A device for evaluation a field programmable gate array (FPGA), the device comprising:
    a memory block;
    an FPGA coupled to the memory block;
    wherein the FPGA comprises:
        a logic module;
        a memory controller; and
        multiple probes coupled between points of interest of cores of the FPGA and the memory controller;

wherein the cores of the FPGA are arranged to execute an additional program while the memory controller is arranged to execute an evaluation program; wherein an execution of the additional program is being evaluated by the evaluation program;

wherein the memory controller is coupled to the multiple points of interest via multiple probes for receiving, during the execution of the evaluation program, captured signals from multiple points of interest and to tag captured signals and retrieving captured signals from the memory block based on values of tags associated with the captured signals;

wherein the memory controller is arranged to transfer at least a portion of the captured signals to at least one memory space of a memory block via memory channels of the FPGA.

21. The device according to claim 20, wherein the memory controller is arranged to output at least a portion of the captured signals from the FPGA via a communication element and wherein the tags are indicative of a type of the captured signals.

22. The device according to claim 20, wherein the FPGA comprises at least forty points of interest.

23. The device according to claim 20, wherein the memory controller is arranged to receive captured signals from at least forty eight points of interest and at a rate of at least sixteen bytes per cycle.

24. The device according to claim 20, wherein an aggregate size of the at least one memory space exceeds one gigabyte.

25. The device according to claim 20, wherein a width of a single point of interest exceeds ten thousand bits.

26. The device according to claim 20, wherein a number of points of interest exceeds fifty thousand.

27. The device according to claim 20, wherein the memory controller is arranged to output captured signals that were captured a long period before the outputting of the captured signals; wherein the long period exceeds one hour.

28. The device according to claim 20, wherein the memory controller is arranged to receive predefined responses to triggers received by the memory controller.

29. The device according to claim 28, wherein a predefined response comprises storing an outcome of an execution of a predefined response to a trigger at the memory block.

30. The device according to claim 28, wherein a predefined response comprises storing captured signals of a certain type while ignoring captured signals of another type.

31. The device according to claim 28, wherein a predefined response comprises either stopping a capture of captured signals from a point of interest or starting a capture of captured signals from the point of interest.

32. The device according to claim 20, wherein the memory controller is arranged to select captured signals to be stored in the memory block and select captured signals to be ignored of; wherein the selecting is responsive to a stage of an evaluation process.

33. The device according to claim 20, wherein the memory controller is arranged to select captured signals to be stored in the memory block and selecting captured signals to be ignored of; wherein the selecting is responsive to previously obtained data or previously detected errors in an execution of the additional program by the FPGA.

34. The device according to claim 20, wherein the memory controller is arranged to transfer at least a portion of the captured signals to at least one memory space of a memory block based on a mapping between memory channels of the memory controller and memory spaces of the memory block.

35. The device according to claim 20, wherein the memory controller is arranged to receive at least one video related control signal selected from a frame indication and a valid indication and storing captured signals from at least one point of interest to the memory block.

36. The device according to claim 20, wherein the memory controller is arranged to duplicate a captured signal to provide two duplicates of the captured signals, to transfer one duplicate of the captured signal to the memory block and to output another duplicate of the captured signal from the FPGA via the communication element.

37. The device according to claim 20, wherein the memory controller is arranged to receive a request from a user, for stopping an execution of the additional program; and ignore captured signals that have been stored before receiving the request by the memory controller of the FPGA but after the request has been issued by the user.

38. The device according to claim 20, wherein the memory controller is arranged to receive a request from a user, for obtaining captured signals that have been captured at previous point in time that occurred at least one fraction of a second before the receiving of the request; and send to a host computer the captured signals.

39. The device according to claim 20, wherein the tags are indicative of whether the captured signals are data signals, video signals, control signals or frame delimitation signals.

40. A device for evaluation a field programmable gate array (FPGA), the device comprising:
  a memory block;
  an FPGA coupled to the memory block;
  wherein the FPGA comprises:
    a logic module;
    a memory controller; and
    multiple probes coupled between multiple points of interest and the memory controller; wherein the multiple points of interest comprise points of interest of cores of the FPGA and at least one external point of interest coupled to a point outside the FPGA;
  wherein the cores of the FPGA are arranged to execute an additional program while the memory controller is arranged to execute an evaluation program; wherein an execution of the additional program is being evaluated by the evaluation program;
  wherein the memory controller is coupled to the multiple points of interest via multiple probes for receiving, during the execution of the evaluation program, captured signals from multiple points of interest;
  wherein the memory controller is arranged to transfer at least a portion of the captured signals to at least one memory space of a memory block via memory channels of the FPGA.

* * * * *